United States Patent [19]

Daley et al.

[11] Patent Number: 4,491,794
[45] Date of Patent: Jan. 1, 1985

[54] HALL EFFECT DEVICE TEST CIRCUIT

[75] Inventors: William J. Daley, Genoa; Hendrik W. Van Husen, Glen Ellyn, both of Ill.

[73] Assignee: GTE Automatic Electric Inc., Northlake, Ill.

[21] Appl. No.: 437,670

[22] Filed: Oct. 29, 1982

[51] Int. Cl.³ .............................................. G01R 33/00
[52] U.S. Cl. ........................... 324/158 R; 324/158 D; 324/202; 324/228; 324/252
[58] Field of Search ............... 324/158 R, 158 D, 202, 324/228, 252; 338/32 H

[56] References Cited

U.S. PATENT DOCUMENTS

| | | | |
|---|---|---|---|
| 2,979,654 | 4/1961 | Storm et al. | 324/228 |
| 3,614,609 | 10/1971 | Grubel et al. | 324/158 R |
| 3,649,912 | 3/1972 | Nakamura | 324/252 |
| 4,190,799 | 2/1980 | Miller et al. | 324/158 D |
| 4,230,987 | 10/1980 | Mordwinkin | 324/228 |
| 4,340,861 | 7/1982 | Spaeks | 324/202 |

Primary Examiner—Stewart J. Levy

[57] ABSTRACT

A Hall effect device test circuit which detects Hall effect device operate and release point failures. A magnetic field circuit, an analog-to-digital conversion circuit, a storage circuit, a comparison circuit and a visual indicator circuit are included. The magnetic field circuit causes the Hall effect device under test to switch between its operate and release states. The analog-to-digital conversion circuit provides a digital value, representative of the intensity of the magnetic field existing at the time of switching. These digital values are then stored in the storage circuit. The comparison circuit compares the stored switching values to predetermined thresholds and causes an appropriate visual pass/fail visual signal to be provided.

15 Claims, 1 Drawing Figure

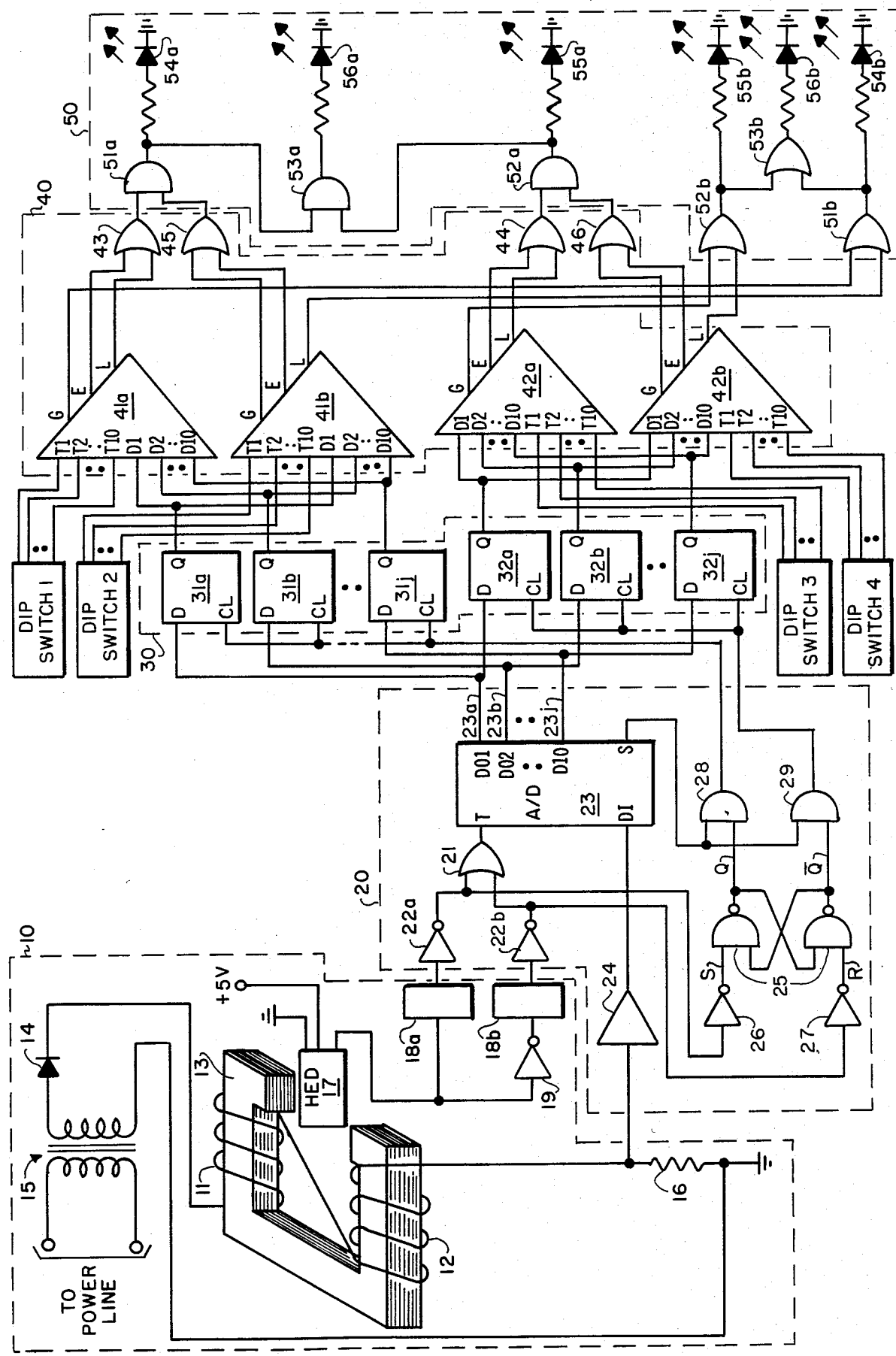

HALL EFFECT DEVICE TEST CIRCUIT

CROSS REFERENCE TO RELATED APPLICATIONS

U.S. patent application, Ser. Nos. 396,177 and 412,758 filed on July 7, 1982, and Aug. 30, 1982, respectively, are related to the present application.

FIELD OF THE INVENTION

The present invention relates to test circuitry and more particularly to a Hall effect device test circuit.

BACKGROUND OF THE INVENTION

Hall effect device related circuitry has been used for a variety of purposes. U.S. Pat. No. 4,156,191, issued to Knight, et al. on May 22, 1979, discloses an apparatus for adjusting the magnetic coupling between a Hall effect device and an operating magnet. U.S. Pat. No. 4,190,799, issued to Miller, et al. on Feb. 26, 1980, discloses a method for measuring the magnitude and sign of the Hall angle of the material of a wafer. U.S. Pat. No. 4,270,087, issued to A. K. Littwin on May 26, 1981, discloses an apparatus for testing permanent magnets using electromagnets and Hall sensors. U.S. Pat. No. 4,084,135, issued to R. S. Enabnit on Apr. 11, 1978, discloses a system and method for checking the sensitivity and performance of an electromagnetic field variation detector. Also, U.S. Pat. No. 4,230,987, issued to G. Mordwinkin on Oct. 28, 1980, discloses a digital eddy current apparatus for generating metallurgical signatures and monitoring metallurgical contents of an electrically conductive material.

While the circuits disclosed in these patents are related to magnetic field or Hall effect devices, none of these patents discloses a method for monitoring the tolerance of the operate and release points of a Hall effect device.

Accordingly, it is the object of the present invention to provide a novel test circuit which monitors the operate and release points of a Hall effect device without utilizing complex timing circuitry.

SUMMARY OF THE INVENTION

In accordance with the present invention, a Hall effect device test circuit is provided. This circuit includes a source of a power signal, magnetic field means connected to the power signal source and operative in response to the power signal to periodically provide a magnetic field of varying intensity.

A voltage reference means is connected to the power source and is operative in response to the power signal to periodically provide a sample voltage of varying magnitude and proportional to the intensity of the magnetic field.

A Hall effect device is connected in magnetic field proximity to the magnetic field means and is operative in response to each occurrence of the magnetic field of a first predetermined intensity to provide an electrical signal of a first characteristic, and is further operative in response to each occurrence of the magnetic field of a second predetermined intensity to provide an electrical signal of a second characteristic.

A conversion means is connected to the Hall effect device and the voltage reference means, and is operative in response to each electrical signal of the first characteristic and the sample voltage to provide a first digital representation of the sample voltage. The conversion means is further operative in response to each electrical signal of the second characteristic and the sample voltage to provide a second digital representation of the sample voltage.

First, second, third and fourth threshold means are operative to provide first, second, third and fourth predetermined digital signals, respectively.

A comparison means is connected to the conversion means and is operative in response to the electrical signal of the first characteristic being less than or equal to the first predetermined digital signal to provide a first operate-pass signal and further operative in response to the electrical signal of the first characteristic being greater than or equal to the second predetermined digital signal to provide a second operate-pass signal; and further operative in response to the electrical signal of the second characteristic being less than or equal to the third predetermined digital signal to provide a first release-pass signal, and further operative in response to the electrical signal of the second characteristic being greater than or equal to the fourth predetermined digital signal to provide a second release-pass signal.

An indicating means is connected to the comparison means and is operative in response to the first and second operate-pass signals to provide a sensible operate-pass signal, and is further operative in response to the first and second release-pass signals to provide a sensible release-pass signal.

DESCRIPTION OF THE DRAWING

The single FIGURE of the accompanying drawing is a schematic diagram of a Hall effect device test circuit in accordance with the present invention.

DESCRIPTION OF THE PREFERRED EMBODIMENT

Referring now to the accompanying drawing, the Hall effect device test circuit of the present invention is shown. Magnetic field circuit 10 is connected between a source of a power signal (power line) and analog-to-digital (A/D) conversion circuit 20 which is connected to storage circuit 30. Comparison circuit 40 is connected between storage circuit 30 and visual indication circuit 50.

Magnetic field circuit 10 includes coils 11 and 12 wound on electromagnet 13. These coils are connected to the power line via diode 14, transformer 15 and voltage reference (sample voltage) resistor 16. The Hall effect device under test, HED 17, is connected in magnetic field proximity to electromagnet 13 and is electrically connected to monostable multivibrator 18a. HED 17 is further connected to monostable multivibrator 18b via inverter 19.

A/D conversion circuit 20 includes OR gate 21 connected to inverters 22a and 22b which are connected to monostable multivibrators 18a and 18b, respectively. Analog-to-digital (A/D) converter 23 is connected to OR gate 21 and amplifier 24 which is connected to sample voltage resistor 16. Latch 25 is connected to inverters 26 and 27 which are connected to inverters 22a and 22b, respectively. AND gate 28 is connected to A/D converter 23 and the Q output of latch 25, while AND gate 29 is connected to A/D converter 23 and the $\overline{Q}$ output of latch 25.

Storage circuit 30 includes first and second groups of 10 D-type flip-flops. Each of the first group of flip-flops, 31a–31j, has its data (D) lead connected to an associated one of the ten (10) data output leads, 23a–23j, of A/D converter 23. The clock (CL) lead of each of these flip-flops is connected to AND gate 28. Similarly, each of the second group of flip-flops, 32a–32j, has its data (D) lead connected to an associated one of the ten (10) data output leads, 23a–23j, of A/D converter 23, but the clock (CL) lead of each of these flip-flops is connected to AND gate 29.

Comparison circuit 40 includes ten-bit binary comparators 41a, 41b, 42a and 42b. Each of the ten (10) data inputs (D1–D10) of both comparators 41a and 41b is connected to an associated one of the first group of flip-flops, 31a–31j. Similarly, each of the ten (10) data inputs (D1–D10) of both comparators 42a and 42b is connected to an associated one of the second group of flip-flops, 32a–32j. The ten (10) threshold inputs (T1–T10) of comparators 41a, 41b, 42a and 42b are connected to Dual-Inline-Package (DIP) SWITCH 1, 2, 3 and 4, respectively. These DIP switches operate to provide predetermined digital threshold signals. OR gates 43 and 44 are connected to the equal-to (E) and less-than (L) outputs of comparators 41a and 42a, respectively, while OR gates 45 and 46 are connected to the greater-than (G) and equal-to (E) outputs of comparators 41b and 42b, respectively.

Visual indication circuit 50 includes AND gate 51a connected to OR gates 43 and 45. AND gate 52a is connected to OR gates 44 and 46, while AND gate 53a is connected to AND gates 51a and 52a. Light emitting diodes (LED) 54a, 55a and 56a are connected to AND gates 51a, 52a and 53a, respectively. OR GATE 51b is connected to the G and L outputs of comparators 41a and 41b, respectively, while OR gate 52b is connected to the G and L outputs of comparators 42a and 42b, respectively. OR gate 53b is connected to OR gates 51b and 52b. Light emitting diodes (LED) 54b, 55b and 56b are connected to OR gates 51b, 52b and 53b, respectively.

Sixty (60) Hertz current is applied to transformer 15 via the power line. This current is converted to a 60 Hertz half wave signal via diode 14. This half wave signal flows through coils 11 and 12, thereby causing a corresponding fluctuating magnetic field in the air gap of electromagnet 13. This half wave signal also flows through sample voltage resistor 16 thereby providing an electrical signal corresponding to the fluctuating magnetic field. When HED 17 is inserted into the gap of electromagnet 13 it switches on and off (operate and releases) at a 60 Hertz rate.

When HED 17 operates it provides an electrical signal of a first characteristic, a logic level 0 operate signal which is converted to a negative going pulse by pulsing circuit, multivibrator 18a. This pulse is inverted to a positive going trigger signal by inverter 22a and applied to OR gate 21 which applies it to the trigger (T) input of A/D converter 23.

The instantaneous intensity of the magnetic field applied to HED 17 is represented by the varying analog voltage developed across sample voltage resistor 16. This voltage is amplified by amplifier 24 and applied to the Data-In (DI) input of A/D converter 23. This amplified voltage signal continuously appears at the DI input of A/D converter 23, but the analog signal appearing at the DI input, is only converted to a digital signal when a trigger signal appears at the T input. Consequently, whenever HED 17 is operated, A/D converter 23 is triggered and the analog signal, representing the intensity of magnetic flux required to operate HED 17, is converted to a digital signal. This digital signal is represented by a ten-bit binary signal appearing at outputs D01–D10 and output leads 23a–23j, respectively. Each bit of this ten-bit binary signal is then applied to the data (D) input of an associated D-type flip-flop of both the first and second groups of flip-flops, 31a–j, and 32a–j, respectively. A/D converter 23 also provides a status signal on its S output when the analog-to-digital conversion is complete.

Similarly, when HED 17 releases, it provides an electrical signal of a second characteristic, a logic level 1 release signal which is inverted to a logic level 0 signal by inverter 19. This logic level 0 signal is then converted to a negative going pulse by pulsing circuit, multivibrator 18b. This pulse is then inverted to a positive going trigger signal by inverter 22b and applied to OR gate 21 which applies it to the trigger (T) input of A/D converter 23. The intensity of the magnetic field required to release HED 17, as represented by the instantaneous analog voltage developed across sample voltage resistor 16 and amplified by amplifier 24 is then converted to a digital signal by A/D converter 23 and applied to the D-type flip-flops of storage circuit 30. Thus A/D converter 23 provides digital values representative of the magnetic field required to operate and release the HED under test.

The positive going operate and release trigger signals provided by inverters 22a and 22b are also applied to inverters 26 and 27, respectively. Inverter 26 inverts the positive going operate trigger signal to a negative going pulse and applies it to the set (S) input of latch 25 causing the latch to set and provide a logic level 1 signal on its Q output. Similarly, the positive going release trigger signal is inverted by inverter 27 and applied to the reset (R) input of latch 25 causing the latch to reset and provide a logic level 1 signal on its $\overline{Q}$ output. Thus the operate and release trigger signals are converted to operate and release logic level 1 signals.

When both the status signal appearing at the S output of A/D converter 23 and the operate signal appearing at the Q output of latch 25 appear at the inputs of AND gate 28, this gate provides a logic level 1 gating signal operate-clock signal which is applied to the CL input of D-type flip-flops 31a–31j. Similarly, when both this status signal and the release signal appearing at the $\overline{Q}$ output of latch 25, appear at the input of gate 29, this gate provides a logic level 1 gating signal release-clock signal, which is applied to the CL input of the first group of D-type flip-flops 32a–32j. Since these D-type flip-flops store the signal appearing at their D input when clocked by a logic level 1 signal at their CL input, the first group of flip-flops, 31a–j, when clocked by a logic level 1 operate signal, stores the digital signal representing the magnetic field required to operate the HED under test. Similarly, when the second group of flip-flops, 32a–32j, is clocked by a logic level 1 release signal, these flip-flops store the digital signals representing the magnetic field required to release the HED under test.

The ten-bit stored signal appearing at the Q outputs of the first group of flip-flops, 31a–j, is then applied to the D1–D10 inputs of binary comparators 41a and 41b. Similarly, the ten-bit stored signal appearing at the Q outputs of the second group of flip-flops, 32a–j, is applied to the D1–D10 inputs of binary comparators 42a and 42b. The T1–T10 inputs of comparators 41a, 41b, 42a and 42b are connected to DIP SWITCH 1, 2, 3 and 4, respectively. These DIP switches provide ten-bit threshold signals for allowable operate and release levels of the HED under test. DIP SWITCH 1 provides the operate-upper-limit (OUL) threshold, DIP SWITCH 2 provides the operate-lower-limit (OLL) threshold, DIP SWITCH 3 provides the release-upper-limit (RUL) threshold and DIP SWITCH 4 provides the release-lower-limit (RLL) threshold.

These binary comparators, 41a, 41b, 42a and 42b, compare the value of magnetic field actually required for the operate and release switching points, OSP and RSP, respectively, of the HED under test, with the associated threshold signal. Comparator 41a compares the actual operate switching point (OSP) to the operate-upper-limit (OUL) threshold. If the OSP is less than or equal to the OUL, then the HED correctly operates at or below the maximum allowable operate level. A logic level 1 signal then appears on the less-than (L) or equal-to (E) output of this comparator and the associated input of OR gate 43. This gate then applies a first operate-pass logic level 1 signal to the first input of AND gate 51a.

Similarly, comparator 41b compares the actual operate switching point (OSP) to the operate-lower-limit (OLL) threshold. If the OSP is greater than or equal to the OLL, then the HED correctly operates at or above the minimum allowable operate level. A logic level 1 signal then appears at the greater-than (G) or equal-to (E) output of this comparator and the associated input of OR gate 45. This gate then applies a second operate-pass logic level 1 signal to the second input of AND gate 51a. When logic level 1 signals appear on both inputs to this gate (51a), the HED under test has operated correctly, i.e. at or above the minimum and at or below the maximum allowable thresholds. AND gate 51a then applies a logic level 1 gated operate-pass signal to the first input of gate 53a and turns on LED 54a to indicate that the operate point of the HED under test is within tolerance.

Comparator 42a compares the actual release switching point (RSP) value to the release-upper-limit (RUL) threshold. If the RSP is equal to or less than the RUL, then the HED correctly releases at or below the maximum allowable release level. A logic level 1 signal then appears on the equal-to (E) or less-than (L) output of this comparator and the associated input of OR gate 44. This gate then applies a first release-pass logic level 1 signal to the first input of AND gate 52a.

Similarly, comparator 42b compares the actual release switching point (RSP) to the release-lower-limit (RLL) threshold. If the RSP is greater than or equal to the RLL, then the HED correctly releases at or above the minimum allowable release level. A logic level 1 signal then appears at the greater-than (G) or equal-to (E) output of this comparator and the associated input of OR gate 46. This gate then applies a second release-pass logic level 1 signal to the second input of AND gate 52a. When logic level 1 signals appear on both inputs to this gate (52a) the HED under test has released correctly, i.e. at or below the maximum and at or above the minimum allowable thresholds. AND gate 52a then applies a logic level 1 gated release-pass signal to the second input of gate 53a and turns on LED 55a to indicate that the release point of the HED under test is within tolerance. AND gate 53a responds to detection of logic level 1 signals on both of its inputs by turning on LED 56a to indicate that the HED under test, both operates and releases, within tolerance.

If either the operate or release switching point is out of tolerance neither the HED pass indicator (LED 56a) nor the associated operate-pass or release-pass indicator LED 54a or LED 55a, respectively, will turn on. In the event of such a failure, the HED fail indicator (LED 56b) and either the operate-fail or release-fail indicator, LED 54b or LED 55b, respectively, will turn on. OR gate 51b causes the operate-fail indicator, LED 54b, to turn on when a logic level 1 signal appears at either of its inputs. These inputs are connected to the greater-than (G) and less-than (L) outputs of comparators 41a and 41b, respectively. Therefore, OR gate 51b applies a logic level 1 gated operated-fail signal to the second input of OR gate 53b and causes the operate-fail indicator, LED 54b, to turn on when the operate switching point (OSP) is greater than the operate-upper-limit (OUL) or less than the operate-lower-limit (OLL) thresholds.

Similarly, OR gate 52b causes the release-fail indicator, LED 55b, to turn on when a logic level 1 signal appears at either of its inputs. These inputs are connected to the greater-than (G) and less-than (L) outputs of comparators 42a and 42b, respectively. Therefore OR gate 52b applies a logic level 1 gated release-fail signal to the first input of OR gate 53b and causes the release-fail indicator, LED 55b, to turn on when the release switching point (RSP) is greater than the release-upper-limit (RUL) or less than the release-lower-limit (RLL) thresholds. OR gate 53b then causes the HED fail indicator, LED 56b, to turn on when either the operate-fail or release-fail indicators turn on, as determined by an associated logic level 1 signal from OR gates 51b and 52b, respectively.

The Hall effect device test circuit of the present invention thus compares the operate and release points of a Hall effect device under test, to predetermined thresholds of magnetic field, which represent the maximum and minimum allowable operate and release points. Visual displays indicate whether the Hall effect device operates and releases correctly.

It will be obvious to those skilled in the art that numerous modifications of the present invention can be made without departing from the spirit of the invention which shall be limited only by the scope of the claims appended hereto.

What is claimed is:

1. A Hall effect device test circuit for use in a test system including a source of a power signal, said test circuit comprising:

magnetic field means connected to said source and operative in response to said power signal to periodically provide a magnetic field of varying intensity;

voltage reference means connected to said source and operative in response to said power signal to periodically provide a sample voltage of varying magnitude and proportional to the intensity of said magnetic field;

a Hall effect device connected in magnetic field proximity to said magnetic field means and operative in response to each occurrence of said magnetic field of a first predetermined intensity to provide an electrical signal of a first characteristic, and operative in response to each occurrence of said magnetic field of a second predetermined intensity to provide an electrical signal of a second characteristic;

conversion means connected to said Hall effect device and said voltage reference means, and operative in response to each electrical signal of said first characteristic and said sample voltage to provide a first digital representation of said sample voltage;
said conversion means further operative in response to each electrical signal of said second characteristic and said sample voltage to provide a second digital representation of said sample voltage;
first threshold means operative to provide a first predetermined digital signal;
second threshold means operative to provide a second predetermined digital signal;
third threshold means operative to provide a third predetermined digital signal;
fourth threshold means operative to provide a fourth predetermined digital signal;
comparison means connected to said conversion means and operative in response to said electrical signal of said first characteristic being less than or equal to said first predetermined digital signal to provide a first operate-pass signal and further operative in response to said electrical signal of said first characteristic being greater than or equal to said second predetermined digital signal to provide a second operate-pass signal; and further operative in response to said electrical signal of said second characteristic being less than or equal to said third predetermined digital signal to provide a first release-pass signal, and further operative in response to said electrical signal of said second characteristic being greater than or equal to said fourth predetermined digital signal to provide a second release-pass signal; and
first indicating means connected to said comparison means and operative in response to said first and second operate-pass signal to provide a sensible operate-pass signal, and further operative in response to said first and second release-pass signals to provide a sensible release-pass signal.

2. A Hall effect device test circuit as claimed in claim 1, wherein said first indicating means is further operative to provide a gated operate-pass signal associated with said sensible operate-pass signal and further operative to provide a gated release-pass signal associated with said sensible release-pass signal, said Hall effect device test circuit further comprising:
second indicating means connected to said first indicating means, and operative in response to said gated operate-pass signal and said gated release-pass signal to provide a sensible HED pass signal.

3. A Hall effect device test circuit as claimed in claim 1, wherein said first indicating means comprises:
a first AND gate and a first light emitting diode connected thereto, and operative to provide said sensible operate-pass signal; and
second AND gate and a second light emitting diode connected thereto, and operative to provide said sensible release-pass signal.

4. A Hall effect device test circuit as claimed in claim 2, wherein said second indicating means comprises: an AND gate and a light emitting diode connected thereto.

5. A Hall effect device test circuit as claimed in claim 1, wherein there is further included: second indicating means operative in response to said electrical signal of said first characteristic being either greater than said first predetermined digital signal or less than said second predetermined digital signal, to provide a sensible operate-fail signal; and further operative in response to said electrical signal of said second characteristic being either greater than said third predetermined digital signal or less than said fourth predetermined digital signal to provide a sensible release-fail signal.

6. A Hall effect device test circuit as claimed in claim 5, wherein said second indicating means is further operative to provide a gated operate-fail signal associated with said sensible operate-fail signal, and further operative to provide a gated release-fail signal associated with said sensible release-fail signal, said Hall effect device test circuit further comprising:
third indicating means connected to said second indicating means, and operative in response to either said gated operate-fail signal or said gated release-fail signal to provide a sensible HED fail signal.

7. A Hall effect device test circuit as claimed in claim 6, wherein said second indicating means comprises:
a first OR gate and a first light emitting diode connected thereto and operative to provide said sensible operate-fail signal; and
a second OR gate and a light emitting diode connected thereto, and operative to provide said sensible release-fail signal.

8. A Hall effect device test circuit as claimed in claim 6, wherein said third indicating means comprises an OR gate and a light emitting diode connected thereto.

9. A Hall effect device test circuit as claimed in claim 1, wherein said comparison means comprises:
a first binary comparator operative to compare said electrical signal of said first characteristic to said first predetermined digital signal;
a second binary comparator operative to compare said electrical signal of said first characteristic to said second predetermined digital signal;
a third binary comparator operative to compare said electrical signal of said second characteristic to said third predetermined digital signal; and
a fourth binary comparator operative to compare said electrical signal of said second characteristic to said fourth predetermined digital signal.

10. A Hall effect device test circuit as claimed in claim 1, wherein said conversion means comprises:
pulsing means connected to said Hall effect device and operative in response to said electrical signals of said first and second characteristics to provide pulsing signals of first and second characteristics;
an analog-to-digital converter connected to said pulsing means and said sample voltage resistor and operative in response to said pulsing signal of said first characteristic and said sample voltage to provide a first digital signal, and further operative in response to said pulsing signal of said second characteristic and said sample voltage to provide a second digital signal; and further operative in response to each of said pulsing signals to provide a status signal; and
gating means connected to said pulsing means and said analog-to-digital converter and operative in response to said pulsing signal of said first characteristic and said status signal to provide a first gating signal and further operative in response to said pulsing signal of said second characteristic and said status signal to provide a second gating signal;
first and second storage means connected to said analog-to-digital conversion means and said gating means and operative in response to said first and second gating signals to store said digital signals of said first and second characteristics, respectively, and provide said first and second digital representations of said sample voltage, respectively.

11. A Hall effect device test circuit as claimed in claim 10, wherein there is further included third storage means connected between said pulsing means and said gating means and operative in response to said pulsing signals of said first and second characteristics to provide level signals of first and second characteristics, respectively; and said gating means operative in response to said status signal and said level signal of said first characteristic, and further operative in response to said status signal and said level signal of said second characteristic to provide said gating signals of first and second characteristics, respectively.

12. A Hall effect device test circuit as claimed in claim 11, wherein said third storage means comprises a latch circuit.

13. A Hall effect device test circuit as claimed in claim 10, wherein said pulsing means comprises first and second monostable miltivibrators operative to provide said first and second pulsing signals, respectively.

14. A Hall effect device test circuit as claimed in claim 1, wherein each of said threshold means comprises a dual-inline-package switch.

15. A Hall effect device test circuit as claimed in claim 10, wherein said first and second storage means comprises first and second groups of D-type flip-flops operative to provide said first and second digital representations of said sample voltage, respectively.

* * * * *